(12) United States Patent
Kanezaki et al.

(10) Patent No.: US 9,524,974 B1
(45) Date of Patent: Dec. 20, 2016

(54) ALTERNATING SIDEWALL ASSISTED PATTERNING

(71) Applicant: SanDisk Technologies, Inc., Plano, TX (US)

(72) Inventors: Erika Kanezaki, Yokkaichi (JP); Ryo Nakamura, Yokkaichi (JP); Kotaro Jinnouchi, Yokkaichi (JP); Satoshi Kamata, Yokkaichi (JP)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/806,111

(22) Filed: Jul. 22, 2015

(51) Int. Cl.
| | |
|---|---|
| *H01L 27/108* | (2006.01) |
| *H01L 21/20* | (2006.01) |
| *H01L 27/115* | (2006.01) |
| *H01L 21/768* | (2006.01) |
| *H01L 27/02* | (2006.01) |

(52) U.S. Cl.
CPC ... *H01L 27/11524* (2013.01); *H01L 21/76816* (2013.01); *H01L 21/76865* (2013.01); *H01L 21/76877* (2013.01); *H01L 27/0207* (2013.01)

(58) Field of Classification Search
CPC .................. H01L 27/11524; H01L 21/76816; H01L 21/76863; H01L 21/76877; H01L 27/0207
USPC .......................................... 257/296; 438/386
See application file for complete search history.

(56) References Cited

U.S. PATENT DOCUMENTS

| | | | |
|---|---|---|---|
| 7,442,976 B2 * | 10/2008 | Juengling | H01L 27/10823 257/296 |
| 7,737,015 B2 | 6/2010 | Kohli et al. | |
| 7,795,080 B2 | 9/2010 | Orimoto et al. | |
| 7,800,155 B2 | 9/2010 | Matsuno | |
| 7,842,558 B2 * | 11/2010 | Juengling | H01L 21/0337 257/216 |
| 7,863,190 B1 | 1/2011 | Papasouliotis | |
| 7,884,415 B2 | 2/2011 | Nagano | |
| 7,905,959 B2 | 3/2011 | Tzu et al. | |
| 8,053,347 B2 | 11/2011 | Kang et al. | |
| 8,129,264 B2 | 3/2012 | Kim et al. | |
| 8,247,291 B2 * | 8/2012 | Min | H01L 21/0337 257/E21.538 |
| 8,362,542 B2 | 1/2013 | Kang et al. | |
| 8,383,479 B2 | 2/2013 | Purayath | |
| 8,492,224 B2 | 7/2013 | Purayath et al. | |
| 8,546,239 B2 | 10/2013 | Harari et al. | |
| 8,603,890 B2 | 12/2013 | Purayath et al. | |
| 8,946,048 B2 * | 2/2015 | Purayath | H01L 21/28273 257/319 |
| 2006/0194390 A1 | 8/2006 | Imai et al. | |
| 2007/0184615 A1 | 8/2007 | Brazzelli et al. | |
| 2007/0257305 A1 | 11/2007 | Sasago et al. | |
| 2008/0003743 A1 | 1/2008 | Lee | |
| 2008/0283898 A1 | 11/2008 | Kuniya | |
| 2009/0212352 A1 | 8/2009 | Aoyama et al. | |
| 2009/0267131 A1 | 10/2009 | Nitta | |
| 2010/0019311 A1 | 1/2010 | Sato et al. | |

(Continued)

*Primary Examiner* — Luan C Thai
(74) *Attorney, Agent, or Firm* — Davis Wright Tremaine LLP

(57) ABSTRACT

A dielectric layer extending over a substrate has alternating first and second trenches extending in a first direction. The first trenches have a first shape in cross section along a plane that is perpendicular to the first direction and the second trenches have a second shape in cross section along the plane. Bit lines are located in at least the first trenches.

20 Claims, 8 Drawing Sheets

(56) References Cited

U.S. PATENT DOCUMENTS

| | | |
|---|---|---|
| 2010/0127320 A1 | 5/2010 | Nishihara et al. |
| 2010/0230741 A1 | 9/2010 | Choi et al. |
| 2011/0057250 A1 | 3/2011 | Higashi |
| 2011/0303967 A1 | 12/2011 | Harari et al. |
| 2011/0309430 A1 | 12/2011 | Purayath et al. |

* cited by examiner

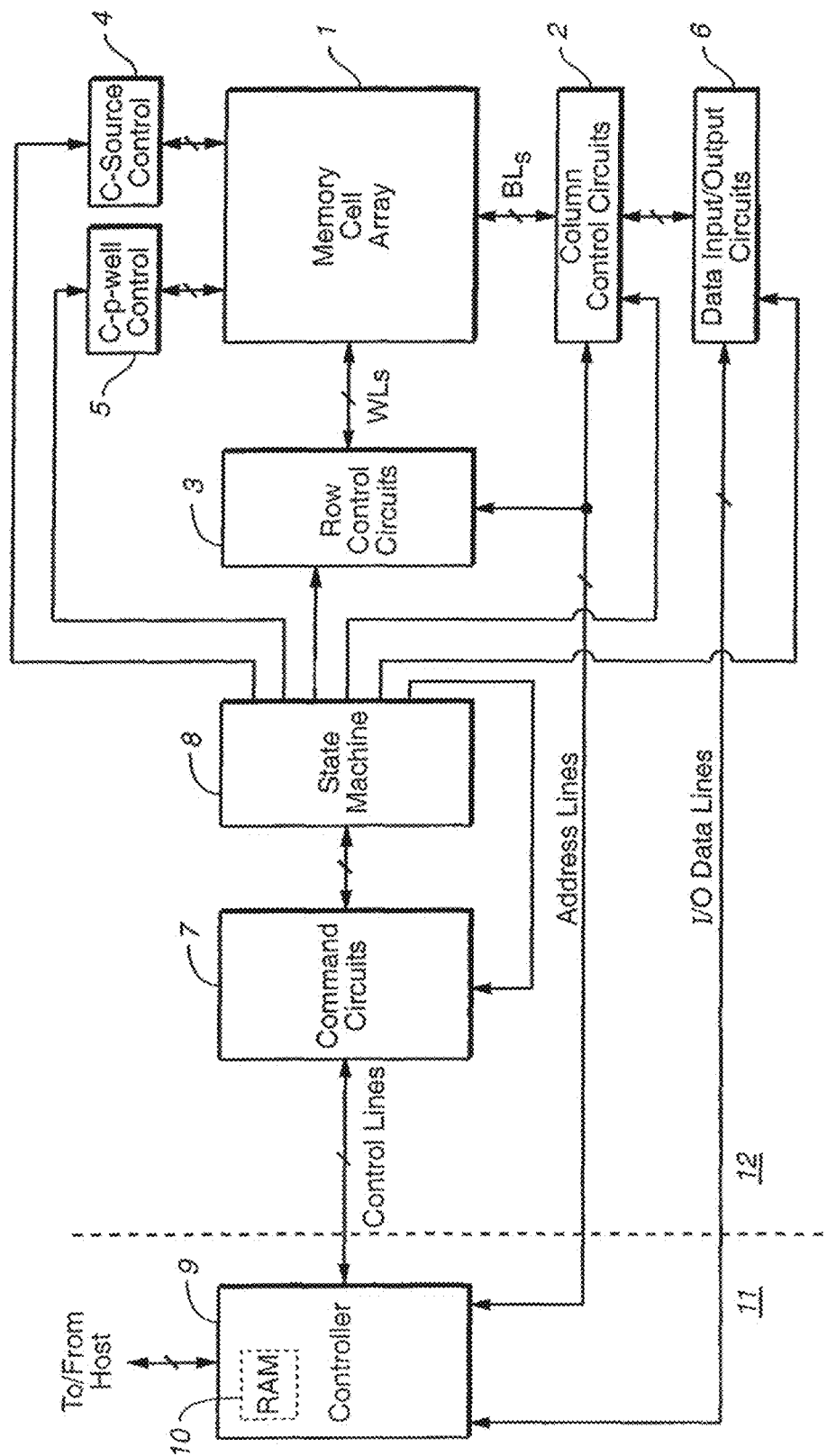
FIG._1
(Prior Art)

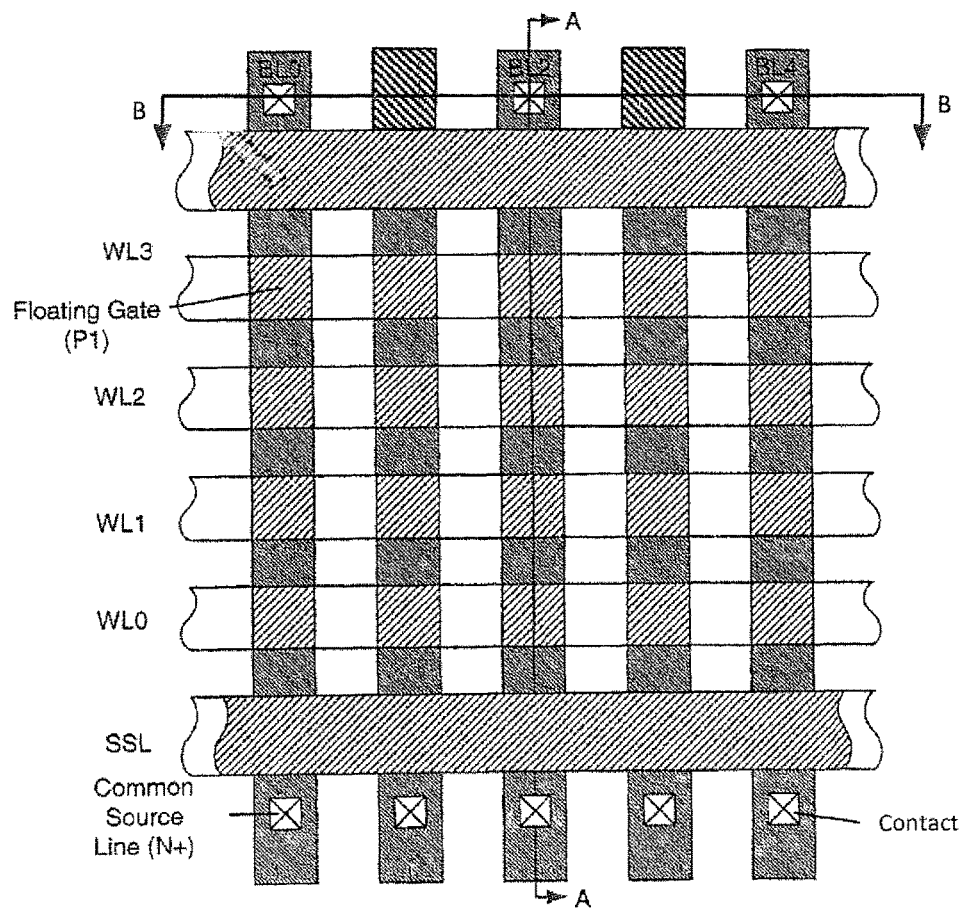
*FIG._ 2A (PRIOR ART)*
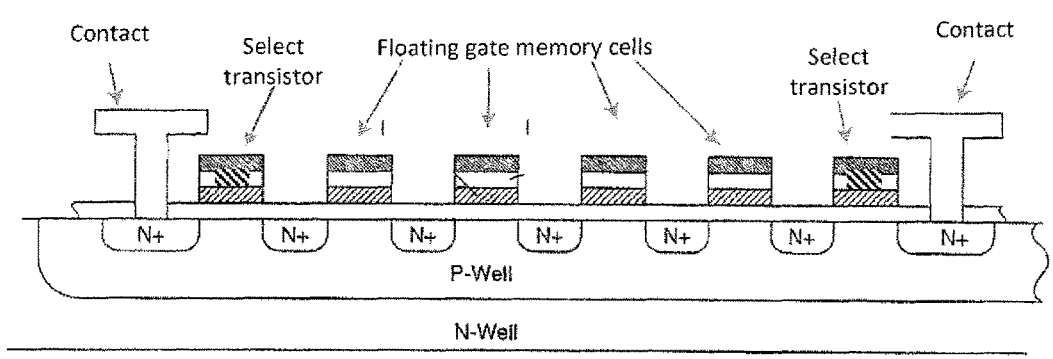
*FIG._ 2B (PRIOR ART)*
(Section A-A)

(Section B-B)

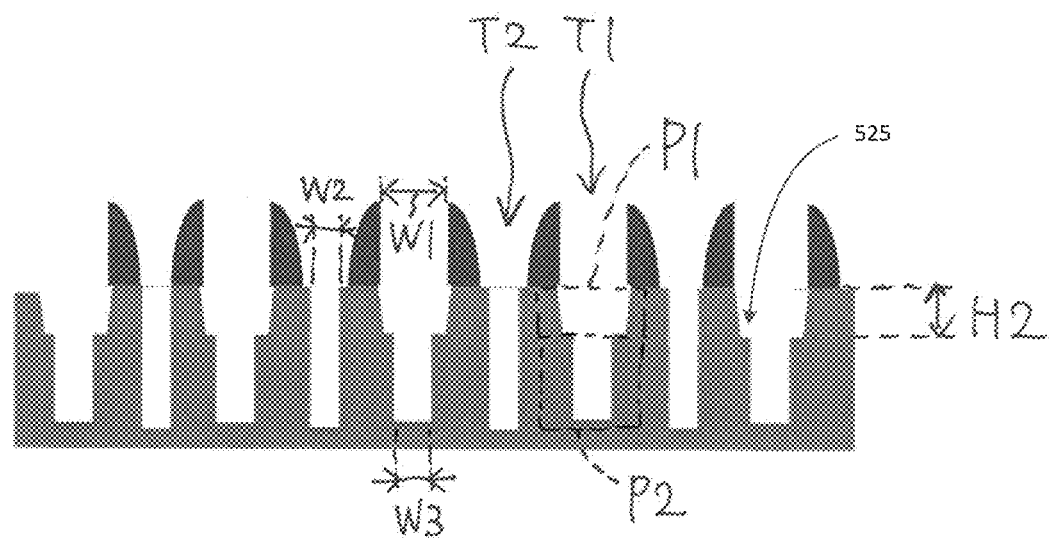
FIG. 5
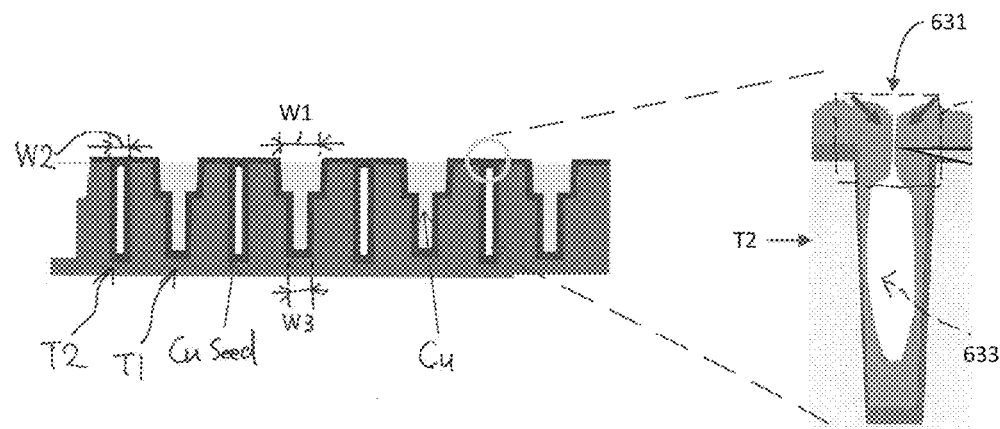
FIG. 6A　　　　　　　　　　FIG. 6B

ALTERNATING SIDEWALL ASSISTED PATTERNING

BACKGROUND

This application relates generally to non-volatile semiconductor memories of the flash memory type, their formation, structure and use.

There are many commercially successful non-volatile memory products being used today, particularly in the form of small form factor cards, USB drives, embedded memory, and Solid State Drives (SSDs) which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. Although four floating gate memory cells are shown in each string, the individual strings typically include 16, 32 or more memory cell charge storage elements, such as floating gates, in a column. Control gate (word) lines labeled WL0-WL3 and string selection lines, Drain Select Line, "DSL" and Source Select Line "SSL" extend across multiple strings over rows of floating gates. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel.

The top and bottom of the string connect to the bit line and a common source line respectively through select transistors (source select transistor and drain select transistor). Select transistors do not contain floating gates and are used to connect NAND strings to control circuits when they are to be accessed, and to isolate them when they are not being accessed.

NAND strings are generally connected by conductive lines in order to form arrays that may contain many NAND strings. At either end of a NAND string a contact area may be formed. This allows connection of the NAND string as part of the array. Metal contact plugs (or "vias") may be formed over contact areas to connect the contact areas (and thereby connect NAND strings) to conductive metal lines that extend over the memory array (e.g. bit lines). FIG. 2A shows bit line contacts BL0-BL4 and common source line contacts at either end of NAND strings. Contacts to contact areas may be formed by etching contact holes through a dielectric layer and then filling the holes with metal to form vias. Metal lines, such as bit lines, extend over the memory array and in peripheral areas in order to connect the memory array and various peripheral circuits. Electrical contact between metal lines and vias occurs where horizontal metal lines intersect vertical contact plugs. These metal lines may be close together (particularly in the memory array area where bit lines may be very close) which tends to make processing difficult and provides a risk of capacitive coupling. The characteristics of such lines (e.g. resistance and coupling) and the quality of connections with vias may be significant factors for good memory operation.

Thus, there is a need for an integrated circuit manufacturing process that forms conductive lines, such as bit lines, in close proximity in an efficient manner.

SUMMARY

A sidewall assisted process may be used to form trenches, e.g. for bit lines, or other conductive lines, so that trenches alternate between two different profiles. For example, a first trench profile may have an upper portion that is significantly wider than a lower portion, while a second trench profile may be substantially rectangular, having the same width from top to bottom. In one example, metal (e.g. copper) is deposited so that air gaps are formed in second trenches while metal is deposited substantially void-free in first trenches. In another example, substantially void-free metal is deposited in both first and second trenches so that alternating conductive lines are formed. Lines formed in first trenches may have wider upper surfaces that facilitate connection of contact plugs from above (e.g. greater tolerance for misalignment). Lines formed in second trenches may have wider lower surfaces that facilitate connection with underlying contact plugs. First and second trenches may be formed so that they have different depths.

An example of a NAND flash memory includes: a semiconductor substrate; a dielectric layer extending over the semiconductor substrate; a plurality of first trenches in the dielectric layer, each first trench being elongated along a first direction and having a first shape in cross section along a plane that is perpendicular to the first direction; a plurality of second trenches in the dielectric layer, each second trench being elongated along the first direction and having a second shape in cross section along the plane, the first and second trenches arranged in an alternating pattern; and a plurality of bit lines located in the first trenches.

A plurality of additional bit lines may be located in the second trenches. The plurality of bit lines and the plurality of additional bit lines may be formed of copper. The first shape may have a first width at a level of an upper surface of the dielectric layer, the second shape may have a second width at the level of the upper surface of the dielectric layer, and the second width may be less than the first width. The first shape may have a third width at a bottom surface of the first shape, the third width being substantially less than the second width, and the second shape may have substantially the second width from top to bottom. A plurality of air gaps may be located in the second trenches. The plurality of first trenches may be filled with copper that forms the plurality of bit lines and the plurality of second trenches may be capped by copper that seals the plurality of air gaps in the second trenches. An individual first trench may have a cross sectional area along the plane that is equal to a cross sectional area of an individual second trench along the plane. The first shape may have an upper portion that extends from a level of an upper surface of the dielectric layer down to an intermediate level with tapering sidewalls, and may have a lower portion that extends from the intermediate level to a bottom surface of the first shape, the lower portion having substantially parallel sidewalls. The second shape may be substantially rectangular. The plurality of first trenches may have a first depth and the plurality of second trenches may have a second depth.

An example of a method of forming a NAND flash memory includes: forming a plurality of NAND strings disposed on a surface of a substrate; depositing a dielectric layer over the plurality of NAND strings; etching a plurality of first trenches in the dielectric layer, each first trench being elongated along a first direction and having a first shape in cross section along a plane that is perpendicular to the first direction; etching a plurality of second trenches in the dielectric layer, each second trench being elongated along the first direction and having a second shape in cross section along the plane, the first and second trenches arranged in an alternating pattern; and depositing metal in the plurality of first trenches to form a plurality of bit lines located in the first trenches.

Prior to etching the plurality of first trenches and the plurality of second trenches, an etch mask may be formed that includes a plurality of mask portions, each mask portion comprising a sidewall spacer part that is formed of a first material and a liner part that is formed of a second material. The second material may have a higher etch rate than the first material and first trenches may be formed at locations corresponding to locations of liner parts of neighboring mask portions. The metal may be deposited in the plurality of second trenches to form a plurality of additional bit lines located in the second trenches. The metal may be deposited in the plurality of second trenches to cap air gaps in the plurality of second trenches.

An example of a method of forming a NAND flash memory includes: forming a plurality of NAND strings disposed on a surface of a substrate; depositing a dielectric layer over the plurality of NAND strings; forming a plurality of mandrels on the dielectric layer; forming a liner layer along side surfaces of the plurality of mandrels; forming sidewall spacers on the liner layer along side surfaces of the plurality of mandrels; removing the plurality of mandrels to leave a pattern of sidewall spacers with portions of liner layer material; subsequently etching a plurality of first trenches in the dielectric layer, an individual first trench formed at a location between sidewall spacers that were formed on a common mandrel; etching a plurality of second trenches in the dielectric layer, an individual second trench formed at a location between sidewall spacers that were formed on neighboring mandrels; and depositing copper in the plurality of first trenches to form a plurality of bit lines located in the first trenches.

Copper may be deposited in the plurality of second trenches to form a plurality of additional bit lines. Depositing copper may include electroplating with conditions that provide substantially void-free filling of the plurality of first trenches and provide significant air-gaps in the plurality of second trenches. The dielectric layer may be formed of silicon oxide, the liner layer may be formed of silicon oxide, the sidewall spacers may be formed of silicon nitride, and the etching may use anisotropic etching that has a significantly higher etch rate for silicon oxide than for silicon nitride.

Various aspects, advantages, features and embodiments are included in the following description of examples, which description should be taken in conjunction with the accompanying drawings.

BRIEF DESCRIPTION OF THE DRAWINGS

FIG. 1 is a block diagram of a prior art memory system.
FIG. 2A is a plan view of a prior art NAND array.
FIG. 2B shows a cross section of the NAND array of FIG. 2A.
FIG. 5 shows different trench patterns formed by the process of FIGS. 4A-D.
FIGS. 6A-B illustrate formation of conductive lines in first trenches and air gaps in second trenches.

DETAILED DESCRIPTION OF EXEMPLARY EMBODIMENTS

Memory System

Figure 2C:
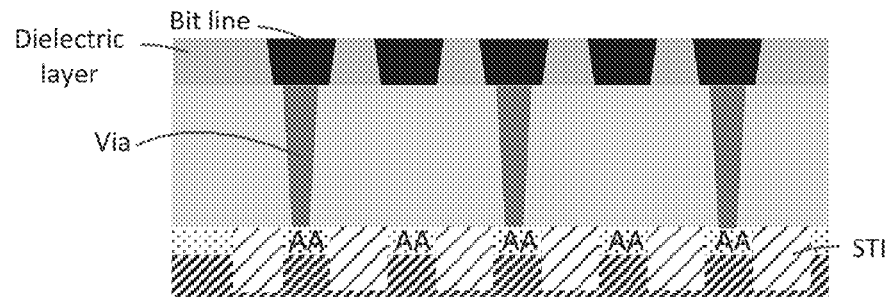
FIG. 2C shows another cross section of the NAND array of FIG. 2A.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

An example of a prior art memory system, which may be modified to include various structures described here, is illustrated by the block diagram of FIG. 1. A planar memory cell array 1 including a plurality of memory cells is controlled by a column control circuit 2, a row control circuit 3, a c-source control circuit 4 and a c-p-well control circuit 5. The memory cell array 1 is, in this example, of the NAND type similar to that described above in the Background. A control circuit 2 is connected to bit lines (BL) of the memory cell array 1 for reading data stored in the memory cells, for determining a state of the memory cells during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells are formed. The c-source control circuit 4 controls a common source line (labeled as "c-source" in FIG. 1) connected to the memory cells (M). The c-p-well control circuit 5 controls the c-p-well voltage.

The data stored in the memory cells are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertable into a mating socket of a host system. Such a card may include the entire memory system, or the controller and memory array, with associated peripheral circuits, may be provided in separate cards. The memory system of FIG. 1 may also be used in a Solid State Drive (SSD) or similar unit that provides mass data storage in a tablet, laptop computer, or similar device. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

FIGS. 2A-2C show different views of a prior art NAND flash memory. In particular, FIG. 2A shows a plan view of a portion of such a memory array including bit lines and word lines (this is a simplified structure with a small number of word lines and bit lines). FIG. 2B shows a cross section along A-A (along a NAND string) showing individual memory cells that are connected in series. Contact plugs, or vias, are formed at either end to connect the NAND strings in the memory array to conductive lines (e.g. connecting to bit lines at one end and to a common source line at the other end). Such a via may be formed of metal that is deposited into a contact hole that is formed in a dielectric layer. FIG. 2C shows a cross section along B-B of FIG. 2A. This view shows metal contact plugs extending down through contact holes in a dielectric layer to make contact with active areas ("AA") in the substrate (i.e. with N+ areas of FIG. 2B). STI regions are located between active areas of different strings to electrically isolate an individual NAND string from its neighbors. Bit lines extend over the memory array in a direction perpendicular to the plane of the cross section shown. Alternating bit lines are connected to vias in the cross section shown. (It will be understood that other vias, that are not visible in the cross section shown, may connect the remaining bit lines to other active areas).

As memories become smaller, the spacing between conductive lines such as bit lines tends to diminish. Accordingly, capacitive coupling between bit lines tends to increase as technology progresses to ever-smaller dimensions. FIG. 2C shows an example of bit lines formed in a dielectric layer. For example, copper bit lines may be formed by a damascene process in which elongated openings, or trenches, are formed in the dielectric layer and then copper is deposited to fill the trenches. When excess copper is removed (e.g. by Chemical Mechanical Polishing, CMP) copper lines remain. A suitable dielectric may be chosen to keep bit line-to-bit line capacitance low. In some cases air gaps may be formed between bit lines to keep bit line-to-bit line coupling low.

Figure 3A:
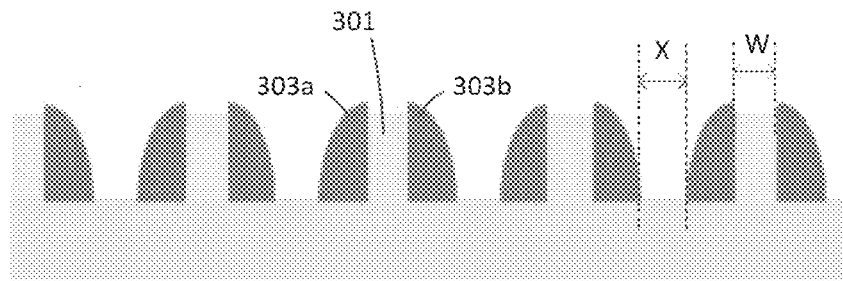
FIGS. 3A-C illustrate an example of sidewall assisted patterning.
Figure 3B:
Figure 3C:
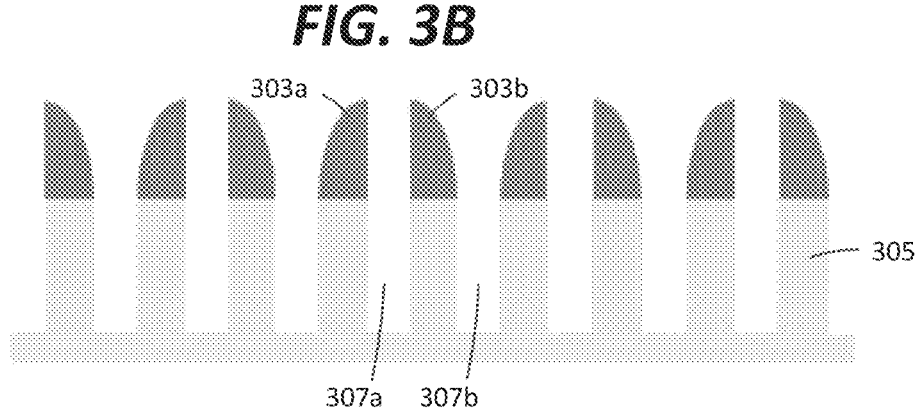

In order to make small features sidewall assisted patterning (SAP) may be used to enable patterning of features that are smaller than the smallest features that can be patterned by direct patterning using a given photolithographic process. FIGS. 3A-C illustrate how a pattern (e.g. word line pattern, or bit line pattern in a NAND flash memory) may be formed by sidewall assisted processing.

FIG. 3A shows mandrels (e.g. mandrel 301) with sidewall spacers (e.g. sidewall spacers 303a-b) formed along sides of the mandrels so that the width, X, of a gap between sidewall spacers formed on sides of neighboring mandrels is approximately equal to the width, W, of a mandrel.

FIG. 3B shows subsequent removal of mandrels. Mandrels may be removed using a selective etch so that sidewall spacers remain substantially unetched by this step. Underlying layer 305 may also be substantially unetched. This etch leaves alternating portions of an upper surface of underlying layer 305 exposed and covered by sidewall spacers. These portions may have approximately the same dimensions.

FIG. 3C shows subsequent etching of underlying layer 305 using sidewall spacers as an etch mask. It can be seen that trenches (e.g. trenches 307a-b) are formed where underlying layer 305 is exposed. Thus, a set of substantially identical trenches are formed. These trenches may be used to form bit lines, or other conductive lines, by filling the trenches with copper and then removing excess copper in a damascene process. Alternatively, a layer that is patterned in this way (patterned like layer 305) may be used to pattern underlying layers (i.e. may be used as an etch mask).

Figure 4A:
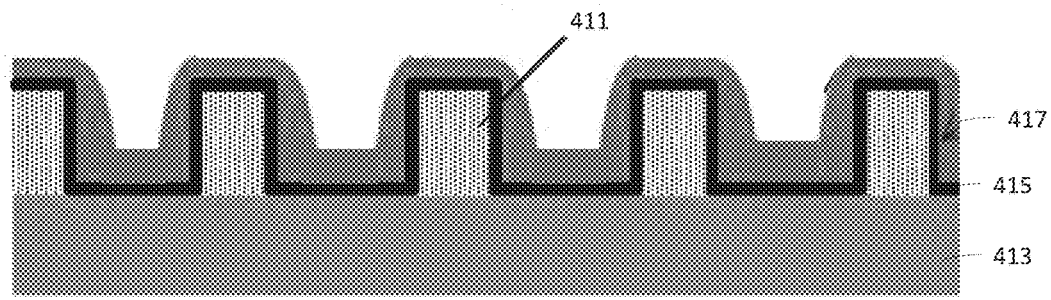
FIGS. 4A-D illustrate another example of sidewall assisted patterning.
Figure 4B:
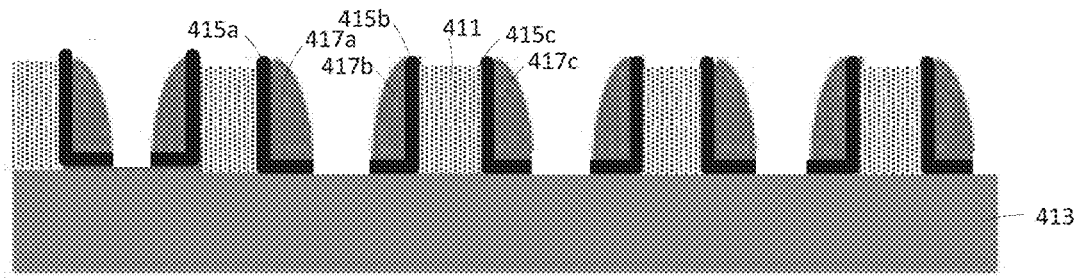
Figure 4C:
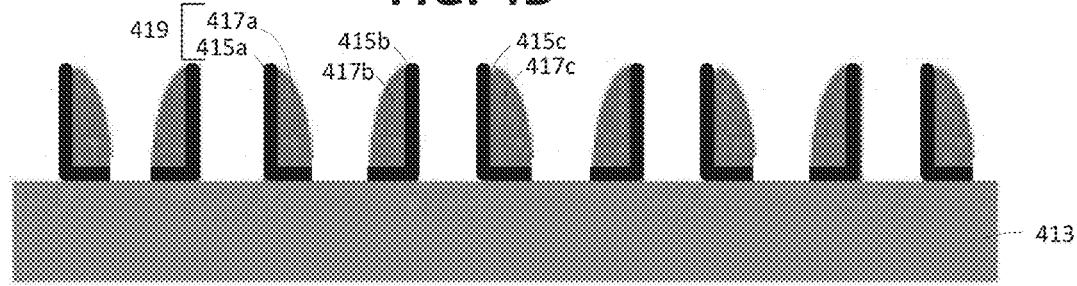

FIGS. 4A-C illustrate an alternative sidewall assisted process for forming trenches. In this example however, trenches are not substantially identical. Instead, trenches are formed so that they alternate between two different types of trench with two different profiles.

FIG. 4A shows a cross section of a portion of an integrated circuit at an intermediate stage of fabrication after mandrels (e.g. mandrel 411) are formed on the surface of a dielectric layer 413. Overlying the mandrels is a liner layer 415. The mandrels may be formed first by an appropriate process. Then, liner layer 415 may be deposited so that it covers all exposed surfaces including sides of mandrels and areas between mandrels. Then, sidewall spacer layer 417 is deposited over the liner layer. Both liner layer 415 and the dielectric layer 413 may be formed of the same material, which is silicon oxide in this example. In other examples, different materials with similar etch properties may be used. Mandrels may be formed of amorphous silicon. The sidewall spacer layer may be formed of a material that is different to the material (or materials) of the liner layer and underlying dielectric so that it has different etch characteristics allowing selective etching of the liner layer and underlying dielectric without substantial etching of sidewall spacer material. An example of a sidewall spacer layer material is silicon nitride.

FIG. 4B shows the structure of FIG. 4A after etching through sidewall spacer layer 417 to leave sidewall spacers (e.g. sidewall spacer 417a-c) lying along sides of mandrels. Liner layer 415 is etched through to form separate portions (e.g. liner layer portions 415a-c) lying between the sidewall spacers and mandrel sides (and under sidewall spacers). Liner layer 415 is etched through over mandrels, thereby exposing upper surfaces of mandrels (e.g. mandrel 411) and is etched through between sidewall spacers thereby exposing the upper surface of dielectric layer 413. Etching may be performed in separate steps, first etching sidewall spacer layer 417, then liner layer 415 using different process conditions.

FIG. 4C shows the structure of FIG. 4B after removal of mandrels. Removal of mandrels may use a selective etch so that sidewall spacers, liner layer portions, and dielectric layer 413 are substantially unaffected by removal of mandrels. This leaves masking portions as shown with each masking portion including a sidewall spacer and a portion of liner layer (e.g. masking portion 419 includes sidewall spacer 417a and liner layer portion 415a).

Figure 4D:
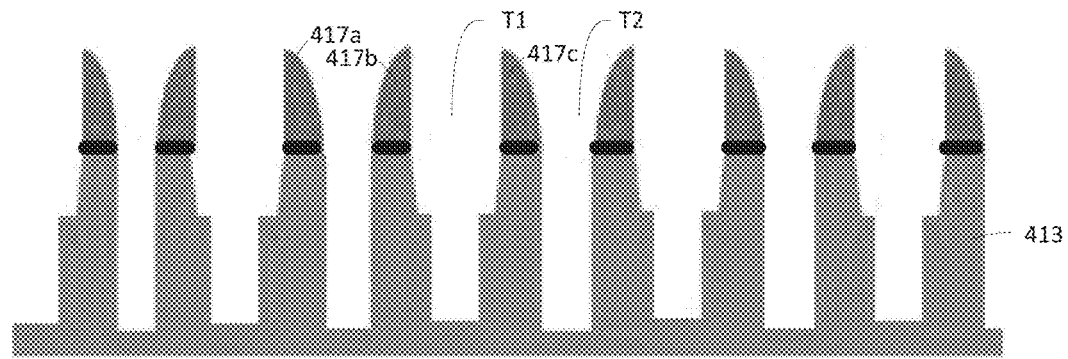

FIG. 4D shows the result of anisotropic etching (e.g. reactive ion etching, RIE) using the pattern of FIG. 4C as an etch mask to etch dielectric layer 413. Etching is not uniform because each mask portion includes a portions of liner layer and a sidewall spacer that are formed of different materials (silicon oxide and silicon nitride respectively in this example) which have different etch characteristics. In particular, the etch used to form trenches is selective to silicon oxide (has a significantly higher etch rate for silicon oxide than for silicon nitride) so that as etching progresses downwards into dielectric layer 413, etching also removes liner layer portions (e.g. liner layer portion 415a) along sides of sidewall spacers. This causes first trenches (T1) between pairs of sidewall spacers that were formed on opposing sides of the same mandrel (e.g. between sidewall spacers 417b-c) to have a profile that is wider at the top than at the bottom. A step is shown that corresponds to the etch breaking through the liner layer portion at an intermediate stage during etching. In contrast to first trenches (T1), second trenches (T2) between sidewall spacers of neighboring mandrels (e.g. between sidewall spacers 417a-b) are substantially uniform. Masking portions have liner layer portions along inner sides but have no such liner layer portions along outer sides so that T2 trenches defined by outer sides of sidewall spacers of neighboring mandrels, remain substantially uniform from top to bottom.

FIG. 5 illustrates the different profiles of first and second types of trenches formed. A first type of trench, T1, is formed where a mandrel was removed and is defined by inner sides of sidewall spacers (where liner layer portions were located). An upper portion, P1, has a width W1 that is approximately equal to the distance between sidewall spacers that define it and a height H2 that is approximately the height of a liner layer portion. The upper portion may taper somewhat down to a step 525. The lower portion, P2, below the step, has a substantially uniform width, W3, which is significantly narrower than the width of the upper portion (W3<W1). W3 is less than W1 by approximately two times the liner layer thickness (W1−W3=2*$T_{liner}$). Thus, first trenches have a T-shaped profile in cross section as shown.

In contrast, a second type of trench, T2, has a substantially uniform width, W2, from top to bottom. Trenches alternate between first and second types, T1 and T2, in an odd-even arrangement, i.e. T1 trenches may be considered odd numbered and T2 trenches may be considered even numbered where trenches are numbered sequentially by physical location. It will be understood that the dimensions and spacing of T1 and T2 trenches may be configured by choosing appropriate dimensions for mandrels, liner layer, sidewall spacers, and by choosing appropriate etch conditions.

Alternating trenches may be used for any suitable purpose, for example, in forming integrated circuits including, but not limited to, NAND flash memories. One example of their use is in a damascene process for forming bit lines. FIG. 6A shows an example where a copper deposition process is used to deposit and remove copper to leave the structure shown. Odd trenches (T1 trenches) are filled with copper in a substantially void-free manner so that conductive lines are formed. A copper seed layer may be deposited first (e.g. by CVD) followed by trench filling (e.g. by electrochemical deposition (ECD)). In contrast, even trenches (T2 trenches) are not filled with copper. Instead, copper seals the top openings of even trenches (T2 trenches) so that air gaps are enclosed by this process. The dimensions of T1 and T2 trenches, and a copper deposition process, may be selected so that T1 trenches, having openings that are W1 wide, are substantially void free, while T2 trenches, having openings that are W2 wide, form voids (or air gaps).

FIG. 6B illustrates how copper deposition may close off a T2 trench opening and thus form a void, or air gap, in the trench. Deposition of copper may occur at a high rate at the opening of a trench in area 631. For example, CVD and/or electrochemical deposition (ECD) of copper may occur at a high rate where a strong electric field occurs at the edges of trench T2. Such high rate growth causes deposition from either side to reduce deposition rates lower down within trench T2. Copper deposited along edges eventually meets and seals off the trench to form air gap 633 as shown. In contrast, wider openings of T1 trenches are not significantly affected by any increased deposition around openings so that deposition within T1 trenches continues and fills the trenches in a substantially void-free manner. Air gaps enclosed in second trenches may reduce coupling between conductive lines formed in first trenches.

Figure 7:
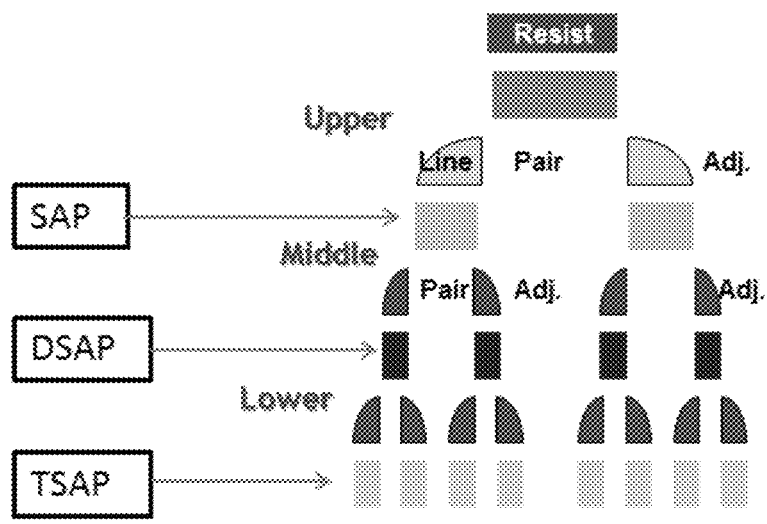
FIG. 7 illustrates different sidewall assisted processes.

Various sidewall assisted processes may be used according to different examples. FIG. 7 illustrates a single SAP process ("SAP") in which two mask portions are defined by two sidewall spacers formed along sides of a mandrel that was patterned directly by photolithography (by a portion of photoresist "Resist"). These mask portions may be used as mandrels (or to define mandrels) on which secondary sidewall spacers are formed (four sidewall spacers, two on each such mandrel) in what may be referred to as a double sidewall assisted process ("DSAP"). Secondary sidewall spacers may define mandrels on which tertiary sidewall spacers are formed (eight sidewall spacers, two on each mandrel) in what may be referred to as a triple sidewall assisted process ("TSAP"). Mandrels of FIG. 4A may be formed by direct patterning, or may be formed by one of the SAP processes illustrated. Thus, even though alternating trenches may be used to form air gaps, conductive line density may be maintained by increasing trench density (e.g. if half of the trenches are used for air gaps as in FIG. 6A then the number of trenches may be doubled by replacing single SAP with DSAP).

Figure 8:
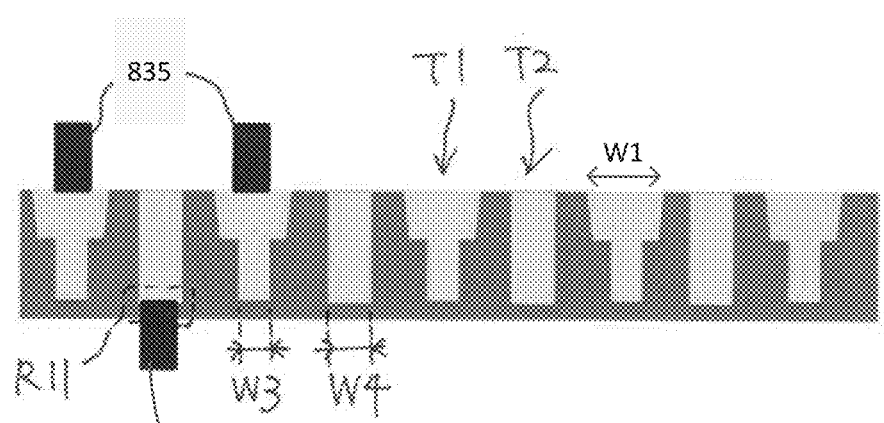
FIG. 8 shows different uses for first and second conductive lines with different profiles.

FIG. 8 shows an example where both first and second trenches (T1 and T2) are filled with metal (e.g. copper) in a substantially void-free manner (i.e. no air gaps are formed in either T1 or T2 trenches). Dimensions of first and second trenches, and metal deposition parameters, may be selected to provide good filling in both trench profiles. Thus conductive metal lines are formed in both first and second trenches. The cross sectional areas of the two profiles may be equal so that the resistances of conductive lines formed in the trenches are equal. Alternatively, cross sectional areas may be configured so that they are different and provide different line resistances. It can be seen that the relatively wide (W1) top surfaces of conductive lines formed in first trenches (T1) facilitate alignment of later-formed overlying contact plugs 835. Overlying contact plugs may have large contact areas and wide margins for misalignment (increased overlay margin). Thus, conductive lines formed in T1 trenches may be suitable for connecting overlying structures. In contrast, relatively wide (W4) lower surfaces of conductive lines formed in second trenches (wide compared with W3) may make second trenches more suitable for connecting with underlying contact plugs and thereby connecting underlying structures, for example, underlying contact plug 837 in region R11. Thus, two different sets of conductive lines may be formed in the same metal layer, by the same process steps, with different characteristics. These different characteristics may make each set of conductive lines suitable for a different purpose so that a single metal layer can form different components that are adapted for different functions.

While previous examples have shown first and second trenches having the same depth, in other examples, trenches are formed with different depths. Microloading effects generally result in higher etching rates in wider openings than in narrower openings. Thus, by choosing suitable etch conditions and trench dimensions, microloading effects may cause one set of trenches to be deeper or shallower than the other.

Figure 9A:
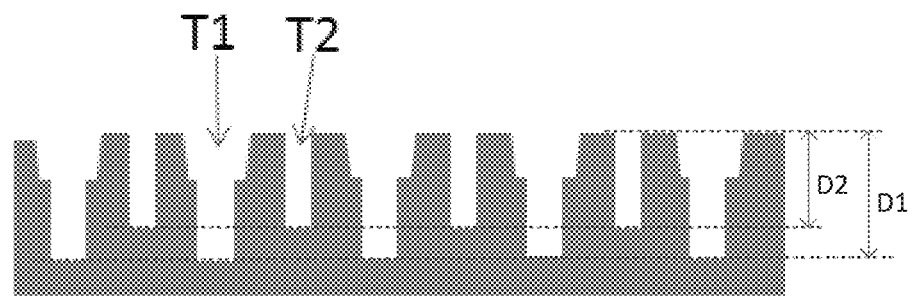
FIGS. 9A-B show first and second trenches with different depths.

FIG. 9A shows an example in which first trenches (T1) have a depth D1 that is deeper than the depth D2 of second trenches (T2). In this example, first trenches are significantly wider than second trenches so that etching progresses faster in first trenches causing them to become deeper.

Figure 9B:
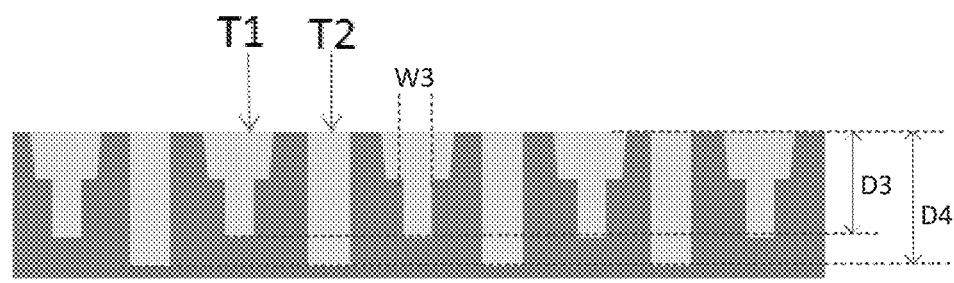

FIG. 9B shows an example in which second trenches (T2) have a depth D4 that is deeper than the depth (D3) of first trenches (T1). Second trenches are wider than the initial width (W3) of first trenches (the width before liner layer portions are etched through) leading to a faster initial etch rate in second trenches. Even though first trenches may subsequently widen, thus reducing microloading effects in first trenches, the result is the shallower first trenches shown.

Figure 10:
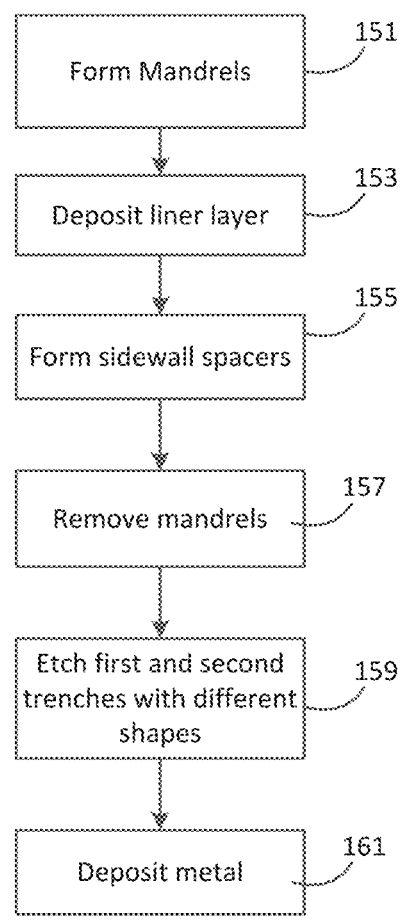
FIG. 10 shows an example of steps used to form a pattern of alternating first and second trenches.

FIG. 10 illustrates an example of steps used in a sidewall assisted process to form a pattern of alternating trenches. Mandrels are formed 151 on a dielectric layer. Formation of mandrels may be by direct patterning (single SAP), or from a sidewall formed by a previous sidewall assisted process (e.g. in a DSAP, or TSAP process). A liner layer is deposited 153 over the mandrels so that sidewalls of mandrels are covered by the liner layer. The liner layer may be the same material as an underlying dielectric layer, or may at least have similar etch characteristics. Then sidewall spacers are formed 155 by depositing a sidewall spacer layer and etching back. This also etches back the liner layer thereby exposing upper surfaces of mandrels. Mandrels are then removed 157 (e.g. by selective etching) to leave a pattern of mask portions, each portion including a sidewall spacer and a portion of the liner layer along one side of the sidewall spacer. First and second trenches are then etched 159 using the pattern of mask portions as an etch mask. The etch is selective to the liner layer and underlying dielectric layer so that etching proceeds down into the liner layer to form trenches and also etches through liner layer portions in alternate gaps. When liner layer portions are etched through, wider gaps are formed by their removal and thus first trenches are formed with a narrower lower portion and a wider upper portion. Subsequently, metal is deposited 161 (e.g. by electroplating). Metal may fill both trenches to form conductive lines (e.g. bit lines of a NAND flash memory), or may fill first trenches and may cap the second trenches to form air gaps in second trenches.

CONCLUSION

Although the various aspects have been described with respect to examples, it will be understood that protection within the full scope of the appended claims is appropriate.

What is claimed is:
1. A NAND flash memory comprising:
a semiconductor substrate;
a dielectric layer extending over the semiconductor substrate;
a plurality of first trenches in the dielectric layer, each first trench being elongated along a first direction and having a first shape in cross section along a plane that is perpendicular to the first direction;
a plurality of second trenches in the dielectric layer, each second trench being elongated along the first direction and having a second shape in cross section along the plane, the second shape being different from the first shape, the first and second trenches arranged in an alternating pattern that alternates from first trench to second trench along a second direction that is perpendicular to the first direction; and
a plurality of bit lines located in the first trenches.

2. The NAND flash memory of claim 1 further comprising a plurality of additional bit lines located in the second trenches, each of the plurality of bit lines having the first shape in cross section along the plane and each of the plurality of additional bit lines having the second shape in cross section along the plane.

3. The NAND flash memory of claim 2 wherein the plurality of bit lines and the plurality of additional bit lines are formed of copper and wherein the cross sectional area of copper of an individual bit line of the plurality of bit lines is substantially equal to the cross sectional area of copper of an individual bit line of the plurality of additional bit lines.

4. The NAND flash memory of claim 1 wherein the first shape has a first width at a level of an upper surface of the dielectric layer, the second shape has a second width at the level of the upper surface of the dielectric layer, and the second width is less than the first width.

5. The NAND flash memory of claim 4 wherein the first shape has a third width at a bottom surface of the first shape, the third width being substantially less than the second width, and the second shape has substantially the second width from top to bottom.

6. The NAND flash memory of claim 1 further comprising a plurality of air gaps located in the second trenches.

7. The NAND flash memory of claim 6 wherein the plurality of first trenches are filled with copper that forms the plurality of bit lines and the plurality of second trenches are capped by copper that seals the plurality of air gaps in the second trenches.

8. The NAND flash memory of claim 1 wherein an individual first trench has a cross sectional area along the plane that is equal to a cross sectional area of an individual second trench along the plane.

9. The NAND flash memory of claim 1 wherein the first shape has an upper portion that extends from a level of an upper surface of the dielectric layer down to an intermediate level with tapering sidewalls, and has a lower portion that extends from the intermediate level to a bottom surface of the first shape, the lower portion having substantially parallel sidewalls.

10. The NAND flash memory of claim 9 wherein the second shape is substantially rectangular.

11. The NAND flash memory of claim 1 wherein the plurality of first trenches have a first depth and the plurality of second trenches have a second depth that is different to the first depth.

12. A method of forming a NAND flash memory comprising:
forming a plurality of NAND strings disposed on a surface of a substrate;
depositing a dielectric layer over the plurality of NAND strings;
etching a plurality of first trenches in the dielectric layer, each first trench being elongated along a first direction and having a first shape in cross section along a plane that is perpendicular to the first direction;
etching a plurality of second trenches in the dielectric layer, each second trench being elongated along the first direction and having a second shape in cross section along the plane, the second shape being different to the first shape, the first and second trenches arranged in an odd-even alternating pattern along a direction that is perpendicular to the first direction such that two first trenches are separated by a second trench; and depositing metal in the plurality of first trenches to form a plurality of bit lines located in the first trenches.

13. The method of claim 12 further comprising, prior to etching the plurality of first trenches and the plurality of second trenches, forming an etch mask that includes a plurality of mask portions, each mask portion comprising a sidewall spacer part that is formed of a first material and a liner part that is formed of a second material.

14. The method of claim 13 wherein the second material has a higher etch rate than the first material and wherein first trenches are formed at locations corresponding to locations of liner parts of neighboring mask portions.

15. The method of claim 12 further comprising depositing the metal in the plurality of second trenches to form a plurality of additional bit lines located in the second trenches.

16. The method of claim 12 further comprising depositing the metal in the plurality of second trenches to cap air gaps in the plurality of second trenches.

17. A method of forming a NAND flash memory comprising:

forming a plurality of NAND strings disposed on a surface of a substrate;

depositing a dielectric layer over the plurality of NAND strings;

forming a plurality of mandrels on the dielectric layer;

forming a liner layer along side surfaces of the plurality of mandrels;

forming sidewall spacers on the liner layer along side surfaces of the plurality of mandrels;

removing the plurality of mandrels to leave a pattern of sidewall spacers with portions of liner layer material;

subsequently etching a plurality of first trenches in the dielectric layer, an individual first trench formed at a location between sidewall spacers that were formed on a common mandrel;

etching a plurality of second trenches in the dielectric layer, an individual second trench formed at a location between sidewall spacers that were formed on neighboring mandrels; and depositing copper in the plurality of first trenches to form a plurality of bit lines located in the first trenches.

18. The method of claim 17 further comprising depositing the copper in the plurality of second trenches to form a plurality of additional bit lines.

19. The method of claim 17 wherein depositing copper comprises electroplating with conditions that provide substantially void-free filling of the plurality of first trenches and provide significant air-gaps in the plurality of second trenches.

20. The method of claim 17 wherein the dielectric layer is formed of silicon oxide, the liner layer is formed of silicon oxide, the sidewall spacers are formed of silicon nitride, and wherein the etching uses anisotropic etching that has a significantly higher etch rate for silicon oxide than for silicon nitride.

\* \* \* \* \*